(12) United States Patent
Seendripu et al.

(10) Patent No.: US 8,311,156 B2
(45) Date of Patent: Nov. 13, 2012

(54) HYBRID RECEIVER ARCHITECTURE USING UPCONVERSION FOLLOWED BY DIRECT DOWNCONVERSION

(75) Inventors: Kishore Seendripu, Carlsbad, CA (US); Raymond Montemayor, Carlsbad, CA (US); Sheng Ye, Carlsbad, CA (US); Glenn Chang, Carlsbad, CA (US); Curtis Ling, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 12/831,225

(22) Filed: Jul. 6, 2010

(65) Prior Publication Data

US 2010/0271558 A1    Oct. 28, 2010

Related U.S. Application Data

(63) Continuation of application No. 11/248,643, filed on Oct. 12, 2005, now abandoned.

(60) Provisional application No. 60/618,241, filed on Oct. 12, 2004.

(51) Int. Cl.
*H03D 3/00* (2006.01)

(52) U.S. Cl. ........ 375/322; 375/316; 375/317; 375/339; 375/340; 375/346

(58) Field of Classification Search .......... 375/136, 375/147, 259, 316, 320, 322, 324, 327, 328, 375/335, 345, 349, 350, 295, 306, 339, 340, 375/344
See application file for complete search history.

(56) References Cited

U.S. PATENT DOCUMENTS

| | | | |
|---|---|---|---|
| 4,262,361 A * | 4/1981 | Hauer | 455/113 |
| 4,653,117 A | 3/1987 | Heck et al. | |
| 4,814,715 A | 3/1989 | Kasperkovitz et al. | |
| 5,101,499 A | 3/1992 | Streck et al. | |
| 5,128,966 A * | 7/1992 | Bang | 375/328 |
| 5,999,802 A | 12/1999 | Aschwanden | |
| 6,166,668 A | 12/2000 | Bautista et al. | |
| 6,240,100 B1 | 5/2001 | Riordan et al. | |
| 6,275,540 B1 | 8/2001 | Barrett, Jr. et al. | |
| 6,282,413 B1 | 8/2001 | Baltus | |
| 6,330,290 B1 | 12/2001 | Glas | |
| 6,334,051 B1 | 12/2001 | Tsurumi et al. | |
| 6,356,218 B1 | 3/2002 | Brown et al. | |

(Continued)

FOREIGN PATENT DOCUMENTS

EP   431397 A2   6/1991

(Continued)

OTHER PUBLICATIONS

U.S. Appl. No. 11/106,061, filed Apr. 13, 2005, Ling.

(Continued)

*Primary Examiner* — Hirdepal Singh
(74) *Attorney, Agent, or Firm* — Kilpatrick Townsend & Stockton, LLP

(57) ABSTRACT

A receiver configured to selectively receive an RF signal from an operating band having a plurality of RF channels. The receiver is configured to upconvert the desired RF channel to an intermediate frequency (IF) greater than the RF channel frequencies. The upconverted RF channel is downconverted to baseband or a low IF. The receiver can perform channel selection by filtering the baseband or low IF signal. The baseband or low IF signal can be upconverted to a programmable output IF.

22 Claims, 4 Drawing Sheets

U.S. PATENT DOCUMENTS

| | | | |
|---|---|---|---|
| 6,498,929 B1 | 12/2002 | Tsurumi et al. | |
| 6,606,359 B1 | 8/2003 | Nag et al. | |
| 6,683,919 B1 * | 1/2004 | Olgaard et al. | 375/316 |
| 6,704,555 B2 | 3/2004 | Sih et al. | |
| 6,731,704 B1 * | 5/2004 | Kiyanagi | 375/346 |
| 6,868,128 B1 | 3/2005 | Lane | |
| 6,940,916 B1 | 9/2005 | Warner et al. | |
| 7,068,171 B2 | 6/2006 | Gardenfors et al. | |
| 7,146,146 B2 | 12/2006 | Masenten et al. | |
| 7,151,917 B2 | 12/2006 | Paulus | |
| 7,181,205 B1 | 2/2007 | Scott et al. | |
| 7,327,198 B2 | 2/2008 | Pan | |
| 7,346,128 B2 | 3/2008 | Hsu et al. | |
| 7,519,348 B2 | 4/2009 | Shah | |
| 7,532,870 B2 | 5/2009 | Ling | |
| 7,567,611 B2 | 7/2009 | Chien | |
| 7,778,613 B2 | 8/2010 | Seendripu et al. | |
| 7,941,102 B2 | 5/2011 | Kerth et al. | |
| 8,196,168 B1 * | 6/2012 | Bryan et al. | 725/46 |
| 2002/0151289 A1 | 10/2002 | Rahman et al. | |
| 2002/0160738 A1 | 10/2002 | Allott et al. | |
| 2003/0003891 A1 | 1/2003 | Kivekas et al. | |
| 2003/0008628 A1 * | 1/2003 | Lindell et al. | 455/180.1 |
| 2003/0012271 A1 | 1/2003 | McReynolds et al. | |
| 2003/0071925 A1 * | 4/2003 | Kanno et al. | 348/726 |
| 2003/0109276 A1 | 6/2003 | Wilson | |
| 2003/0129955 A1 | 7/2003 | Gilmore | |
| 2003/0142234 A1 | 7/2003 | Dent | |
| 2003/0174641 A1 | 9/2003 | Rahman | |
| 2003/0176174 A1 | 9/2003 | Seppinen et al. | |
| 2003/0186669 A1 | 10/2003 | Yamawaki et al. | |
| 2003/0207674 A1 | 11/2003 | Hughes | |
| 2004/0015246 A1 * | 1/2004 | Gamm et al. | 700/39 |
| 2004/0038649 A1 | 2/2004 | Lin et al. | |
| 2004/0106380 A1 | 6/2004 | Vassiliou et al. | |
| 2004/0110482 A1 | 6/2004 | Chung | |
| 2004/0137869 A1 | 7/2004 | Kim | |
| 2004/0146120 A1 | 7/2004 | Brown | |
| 2004/0152436 A1 | 8/2004 | Masenten et al. | |
| 2004/0161025 A1 | 8/2004 | Mohindra | |
| 2004/0176058 A1 | 9/2004 | Johnson | |
| 2005/0059376 A1 | 3/2005 | Davis | |
| 2005/0069056 A1 | 3/2005 | Willingham | |
| 2005/0221781 A1 | 10/2005 | Lin et al. | |
| 2005/0232382 A1 | 10/2005 | Stikvoort et al. | |
| 2005/0233723 A1 | 10/2005 | Gomez et al. | |
| 2005/0239428 A1 | 10/2005 | Seendripu et al. | |
| 2005/0248478 A1 | 11/2005 | Ling | |
| 2005/0259186 A1 * | 11/2005 | Mehr et al. | 348/731 |
| 2006/0025099 A1 | 2/2006 | Jung et al. | |
| 2006/0073800 A1 | 4/2006 | Johnson et al. | |
| 2006/0078069 A1 | 4/2006 | Seendripu et al. | |
| 2006/0083335 A1 | 4/2006 | Seendripu et al. | |
| 2006/0160518 A1 | 7/2006 | Seendripu et al. | |
| 2006/0223457 A1 | 10/2006 | Rahman | |
| 2006/0252399 A1 | 11/2006 | Paulus | |
| 2007/0058755 A1 | 3/2007 | Husted | |
| 2007/0077908 A1 | 4/2007 | Vorenkamp et al. | |
| 2007/0123188 A1 | 5/2007 | Mo et al. | |
| 2007/0218850 A1 * | 9/2007 | Pan | 455/189.1 |
| 2008/0014895 A1 | 1/2008 | Li et al. | |
| 2008/0250460 A1 | 10/2008 | Khoini-Poorfard et al. | |
| 2008/0318536 A1 | 12/2008 | Suominen | |
| 2009/0088120 A1 | 4/2009 | Ling et al. | |
| 2010/0003943 A1 | 1/2010 | Seendripu et al. | |
| 2010/0167684 A1 | 7/2010 | Kerth | |

FOREIGN PATENT DOCUMENTS

| | | |
|---|---|---|
| EP | 473373 A2 | 3/1992 |
| EP | 594894 A1 | 5/1994 |
| EP | 840484 A2 | 5/1998 |
| EP | 964557 A1 | 12/1999 |
| EP | 1164759 A2 | 12/2001 |
| EP | 1172928 A2 | 1/2002 |
| EP | 1182775 A2 | 2/2002 |
| EP | 1294151 A1 | 3/2003 |
| EP | 1300956 A1 | 4/2003 |
| EP | 1376967 A2 | 1/2004 |
| GB | 2392566 A | 3/2004 |
| JP | 59-186431 A | 10/1984 |
| JP | 09/36663 A | 2/1997 |
| JP | 11-041033 A2 | 2/1999 |
| JP | 11/225179 A | 8/1999 |
| JP | 2000/286643 A | 10/2000 |
| JP | 2004/179841 A | 6/2004 |
| WO | WO 97/06604 A1 | 2/1997 |
| WO | WO 98/45942 A3 | 10/1998 |
| WO | WO 02/29985 A2 | 4/2002 |
| WO | WO 2004/006433 A1 | 1/2004 |
| WO | WO 2005/101648 A1 | 10/2005 |
| WO | WO 2005/101671 A2 | 10/2005 |
| WO | WO 2006/044372 A2 | 4/2006 |
| WO | WO 2006/044373 A1 | 4/2006 |
| WO | WO 2006/063358 A1 | 6/2006 |

OTHER PUBLICATIONS

U.S. Appl. No. 11/106,055, filed Apr. 13, 2005, Seendripu et al.
U.S. Appl. No. 12/831,201, filed Jul. 6, 2010, Seendripu et al.
U.S. Appl. No. 12/831,152, filed Jul. 6, 2010, Seendripu et al.
Aschwanden, "Direct conversion-how to make it work in TV tuners," IEEE Transactions on Consumer Electronics, Aug. 1996, vol. 42, No. 3, pp. 729-738.
Guo, et al., "A Fully Integrated 90-MHz CMOS Wireless Receiver With On-Chip RF and IF Filters and 79-dB Image Rejection," IEEE Journal of Solid-State Circuits, Aug. 2002, vol. 37, No. 8, pp. 1084-1089.
Lee, et al. "Full-CMOS 2-GHz WCDMA Direct Conversion Transmitter and Receiver," IEEE Journal of Solid-State Circuits, Jan. 2003, vol. 38, No. 1, pp. 43-53.
Van Sinderen, et al., "A 48-860 MHZ Digital Cable Tuner IC With Integrated RF and IF Selectivity," International Solid-State Circuits Conference, 2003 Digest of Technical Papers, Feb. 12, 2003, 10 pages, IEEE.
Weaver, "A Third Method of Generation and Detection of Single-Sideband Signals", Proceedings of the IRE, 1956, vol. 44, No. 12, pp. 1703-1705.
Weldon, "A 1.75-GHz Highly Integrated Narrow-Band CMOS Transmitter With Harmonic-Rejection Mixers," IEEE Journal of Solid-State Circuits, Dec. 2001, vol. 36, No. 12, pp. 2003-2015.
European Communication for Application No. EP05733984.8, dated Sep. 17, 2007, 4 pages.
European Communication for Application No. EP05733984.8, dated Jun. 13, 2008, 5 pages.
European Communication for Application No. EP05733984.8, dated Oct. 27, 2009, 50 pages.
European Communication for Application No. EP05738651.8, mailed on May 16, 2008, 5 pages.
European Communication for Application No. EP05738651.8, dated Sep. 17, 2007, 2 pages.
European Communication for Application No. EP05809078.8, dated Feb. 27, 2008, 3 pages.
European Communication for Application No. EP05809078.8, dated Apr. 17, 2009, 5 pages.
European Communication for Application No. EP05810558.6, dated Dec. 13, 2007, 4 pages.
European Communication for Application No. EP05810558.6, dated Oct. 28, 2008, 4 pages.
European Communication for Application No. EP05853911.5, dated Oct. 8, 2007, 4 pages.
European Communication for Application No. EP05853911.5, dated May 2, 2008, 3 pages.
European Communication for Application No. EP05853911.5, dated Nov. 26, 2008, 3 pages.
European Search Report for Application No. EP10001057.8, dated Mar. 5, 2010, 8 pages.
Japanese Office Action for Application No. 2007/545724, mailed on Aug. 10, 2010, 8 pages.
International Search Report of Aug. 2, 2005 in International Application No. PCT/US2005/012906, 4 pages.
Written Opinion of Aug. 2, 2005 in International Application No. PCT/US2005/012906, 8 pages.

International Preliminary Report on Patentability of Oct. 26, 2006 in International Application No. PCT/US2005/012906, 10 pages.
International Search Report of the International Searching Authority for Application No. PCT/US2005/012907, dated Oct. 12, 2005, 6 pages.
Written Opinion of the International Searching Authority for Application No. PCT/US2005/012907, Oct. 12, 2005, 10 pages.
International Preliminary Report on Patentability of Oct. 26, 2006 in International Application No. PCT/US2005/012907, 12 pages.
International Search Report of the International Searching Authority for Application No. PCT/US2005036513, mailed on May 19, 2006, 6 pages.
Written Opinion of the International Searching Authority for Application No. PCT/US2005/036513, mailed on May 19, 2006, 8 pages.
International Preliminary Report on Patentability for Application No. PCT/US2005/036513, mailed on Apr. 26, 2007, 10 pages.
International Search Report of the International Searching Authority for Application No. PCT/US2005/036514, mailed on Feb. 7, 2006, 5 pages.
Written Opinion of the International Searching Authority for Application No. PCT/US2005/036514, mailed on Feb. 7, 2006, 8 pages.
International Preliminary Report on Patentability for Application No. PCT/US2005/036514, mailed on Apr. 26, 2007, 10 pages.
International Search Report of the International Searching Authority for Application No. PCT/US2005/045099, mailed on Apr. 3, 2006, 3 pages.
Written Opinion of the International Searching Authority for Application No. PCT/US2005/045099, mailed on Apr. 3, 2006, 4 pages.
International Preliminary Report on Patentability for Application No. PCT/US2005/045099, dated Jun. 21, 2007, 6 pages.
Non-Final Office Action for U.S. Appl. No. 11/106,055, mailed on Nov. 21, 2007, 11 pages.
Response to Non-Final Office Action for U.S. Appl. No. 11/106,055, filed Mar. 18, 2008, 18 pages.
Final Office Action for U.S. Appl. No. 11/106,055, mailed on May 7, 2008, 11 pages.
Response to Final Office Action for U.S. Appl. No. 11/106,055, filed Aug. 8, 2008, 19 pages.
Non-Final Office Action for U.S. Appl. No. 11/106,055, mailed on Sep. 30, 2008, 14 pages.
Response to Non-Final Office Action for U.S. Appl. No. 11/106,055, filed Mar. 27, 2009, 17 pages.
Final Office Action for U.S. Appl. No. 11/106,055, mailed on Jun. 4, 2009, 12 pages.
Response to Final Office Action for U.S. Appl. No. 11/106,055, filed Oct. 1, 2009, 20 pages.
Notice of Allowance for U.S. Appl. No. 11/106,055, mailed on Nov. 18, 2009, 6 pages.
Notice of Allowance for U.S. Appl. No. 11/106,055, mailed on Apr. 2, 2010, 12 pages.
Requirement for Restriction/Election for U.S. Appl. No. 11/106,061, mailed on Sep. 27, 2007, 7 pages.
Response to Requirement for Restriction/Election for U.S. Appl. No. 11/106,061, filed Oct. 26, 2007, 17 pages.
Non-Final Office Action for U.S. Appl. No. 11/106,061, mailed on Jan. 7, 2008, 11 pages.
Response to Non-Final Office Action for U.S. Appl. No. 11/106,061, filed May 21, 2008, 14 pages.
Notice of Allowance for U.S. Appl. No. 11/106,061, mailed on Sep. 10, 2008, 10 pages.
Supplemental Notice of Allowance for U.S. Appl. No. 11/106,061, mailed on Sep. 16, 2008, 6 pages.
Notice of Allowance for U.S. Appl. No. 11/106,061, mailed on Dec. 31, 2008, 8 pages.
Non-Final Office Action for U.S. Appl. No. 11/248,643, mailed on Aug. 20, 2008, 15 pages.
Response to Non-Final Office Action for U.S. Appl. No. 11/248,643, filed Feb. 20, 2009, 13 pages.
Response to Final Office Action for U.S. Appl. No. 11/248,643, filed Dec. 1, 2009, 14 pages.
Final Office Action for U.S. Appl. No. 11/248,643, mailed on Jun. 4, 2009, 10 pages.
Non-Final Office Action for U.S. Appl. No. 11/248,643, mailed on Jan. 6, 2010, 12 pages.
Non-Final Office Action for U.S. Appl. No. 11/248,657, mailed on Sep. 5, 2008, 20 pages.
Response to Non-Final Office Action for U.S. Appl. No. 11/248,657, filed Mar. 2, 2009, 15 pages.
Final Office Action for U.S. Appl. No. 11/248,657, mailed on Jun. 24, 2009, 11 pages.
Response to Final Office Action for U.S. Appl. No. 11/248,657, filed Dec. 17, 2009, 18 pages.
Non-Final Office Action for U.S. Appl. No. 11/248,657, mailed on Jan. 6, 2010, 20 pages.
Requirement for Restriction/Election for U.S. Appl. No. 11/302,531, mailed on Jul. 21, 2008, 9 pages.
Response to Requirement for Restriction/Election for U.S. Appl. No. 11/302,531, filed Sep. 12, 2008, 8 pages.
Non-Final Office Action for U.S. Appl. No. 11/302,531, mailed on Oct. 29, 2008, 15 pages.
Non-Final Office Action for U.S. Appl. No. 12/432,666, mailed on May 26, 2010, 20 pages.
Non-Final Office Action for U.S. Appl. No. 12/831,201, mailed on Feb. 3, 2011, 28 pages.
European Search Report for Application No. EP09006094.8, dated Apr. 25, 2012, 10 pages.
Notice of Allowance for Japanese Patent Application No. 2007-508580, mailed Mar. 1, 2012.
Japanese Final Office Action for Application No. 2007-508580, mailed Aug. 10, 2011, 7 pages.
Japanese Office Action for Application No. 2007-508580, mailed Jan. 4, 2011, 8 pages.
Partial European Search Report for Application No. EP09006094.8, dated Nov. 28, 2011, 5 pages.
Final Office Action for U.S. Appl. No. 12/831,152, mailed on Dec. 16, 2011, 9 pages.
Final Office Action for U.S. Appl. No. 12/831,201, mailed on Dec. 20, 2011, 14 pages.
Non Final Office Action for U.S. Appl. No. 12/831,152, mailed Jun. 2, 2011, 9 pages.
Notice of Allowance for Japanese Patent Application No. 2007-508580, mailed on Mar. 1, 2012.
Notice of Allowance for U.S. Appl. No. 12/831,201, mailed on Jul. 12, 2012, 12 pages.

* cited by examiner

HYBRID RECEIVER ARCHITECTURE USING UPCONVERSION FOLLOWED BY DIRECT DOWNCONVERSION

CROSS-REFERENCES TO RELATED APPLICATIONS

This application is a continuation of U.S. application Ser. No. 11/248,643, filed Oct. 12, 2005, which claims benefit under 35 U.S.C. 119(e) of U.S. Application No. 60/618,241, filed Oct. 12, 2004, both of which are incorporated herein by reference in their entirety.

BACKGROUND OF THE INVENTION

The disclosure relates to electronic signal processing. More particularly, the disclosure relates to an RF receiver and receiver architecture.

In a typical frequency division multiplex communication system, multiple transmissions can simultaneously occupy a predefined operating band. The signals within the operating band can operate according to a predetermined communication standard, and thus, can have an energy within a predictable dynamic range. The communication standard can also specify a frequency spacing between adjacent channels, and the channel bandwidth. The communication standard can also specify signal parameters, such as modulation type, information rates, out of channel performance, as well as other signal parameters.

Additionally, there can be numerous signal sources operating outside of the operating band. Unlike the signals within the operating band, the out of band signals are typically not regulated by the communication standard regulating the in band signal performance. As a result, out of band signals may have substantially greater energy relative to the in-band signals, and can operate according to different signal parameters, including modulation type, out of band performance, and other parameters.

In order to tune to a desired channel, a receiver needs to substantially eliminate the effects of undesired channels, including those known interferers occurring within known operating bands as well as unanticipated interferers.

Many receiver implementations have been developed to support the various communication standards. The trend of increasing device complexity and performance while simultaneously reducing the physical size of electronic devices imposes tremendous constraints on ongoing development.

For example, the size of cellular and cordless telephones continues to shrink while simultaneously improving the quality of the device and adding additional functionality to the device. Similarly, radios and televisions are constantly being redesigned to provide improved features and operating modes while simultaneously decreasing physical size. Although the screen size available in television receivers continues to grow, the advancement of technologies that enable flat screens and short depths greatly reduce the volume available for electronics.

It is desirable to increase the ability of a receiver to operate in multiple modes or frequency bands without compromising received signal quality. Additionally, it is desirable for a receiver implementation to minimize size, cost, and power consumption over implementations presently available.

BRIEF SUMMARY OF THE INVENTION

A receiver configured to selectively receive an RF signal from an operating band having a plurality of RF channels. The receiver is configured to upconvert the desired RF channel to an intermediate frequency (IF) greater than the RF channel frequencies. The upconverted RF channel is downconverted to baseband or a low IF. The receiver can perform channel selection by filtering the baseband or low IF signal. The baseband or low IF signal can be upconverted to a programmable output IF.

The disclosure includes a receiver that includes an upconverter configured to frequency convert an input signal to an intermediate frequency signal in a frequency band greater than at least a portion of an input signal frequency band, a downconverter coupled to the upconverter and configured to frequency convert the intermediate frequency signal to a baseband signal, and a filter coupled to the downconverter and configured to filter the baseband signal.

The disclosure includes a receiver that includes a first upconverter configured to upconvert a desired RF signal to a first Intermediate Frequency (IF) that is greater than a frequency of the desired RF signal, a filter coupled to the upconverter and configured to perform band selection filtering of a signal output by the upconverter to generate a filtered upconverted signal, a quadrature direct downconverter configured to downconvert a desired signal in the filtered upconverted signal to in-phase and quadrature signal components, a first filter coupled to the quadrature direct downconverter and configured to perform channel selection filtering on the in-phase signal component, a second filter coupled to the quadrature direct downconverter and configured to perform channel selection filtering on the quadrature signal component, a second upconverter coupled to the first and second filters and configured to upconvert the filtered in-phase and quadrature signal components to in-phase and quadrature output IF signal components, and a signal combiner coupled to the second upconverter and configured to combine the in-phase and quadrature output IF signal components.

The disclosure includes a method of processing a received signal. The method includes upconverting a desired input signal to a first intermediate frequency (IF) signal at a frequency greater than a frequency of the desired input signal, downconverting the first IF signal to a baseband signal, and performing channel selection on the baseband signal.

The disclosure includes a method of processing a received signal. The method includes selecting a desired television signal at a desired RF channel, upconverting the desired television signal to a first Intermediate Frequency (IF) that is greater than a frequency of the desired RF channel;

direct downconverting the desired television signal from the first IF to in-phase and quadrature signal components, performing channel selection filtering on each of the in-phase and quadrature signal components, upconverting the in-phase and quadrature signal components to second IF in-phase and quadrature signal components at a desired second IF, and combining the second IF in-phase and quadrature signal components to generate the desired television signal at the second IF.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE INVENTION

A receiver and method of receiving signals incorporating initial upconversion of the desired signal. The desired signal can be upconverted to a first Intermediate Frequency (IF) that may be a fixed first IF. In another embodiment, the first IF can be a programmable IF or may depend on the frequency of the desired signal.

The receiver can be configured to perform filtering at the first IF, for example, to perform band selection. The receiver is configured to direct downconvert the desired signal at the first IF to a baseband signal or low IF signal. The receiver can implement quadrature downconversion downconverting the first IF signal to an in-phase signal component and a quadrature signal component. In the embodiment where the receiver performs direct conversion to a zero IF, the receiver generates in-phase baseband signals and quadrature baseband signals.

The receiver can filter each of the in-phase and quadrature signal components to perform channel selection. The receiver upconverts the filtered in-phase and quadrature signal components to a second IF that may be fixed or programmable. Upconversion to a second IF can be useful for providing compatibility with existing demodulators. This receiver architecture is particularly useful for broadband applications such as television reception, where the wide frequency range can create undesired interaction between the desired signal and other legitimate channels in the spectrum.

The receiver architecture having upconversion followed by direct downconversion and a second upconversion to a desired IF provides numerous advantages over other receiver architectures. The ability to perform channel selection at baseband or low IF facilitates on-chip implementation of channel selection filtering. The ability to virtually eliminate all adjacent channels and other interferers relaxes the requirements of the output filter and can eliminate the need for off-chip IF filtering in many applications. The upconversion to a first IF greater than the RF channel frequencies virtually eliminates gain-dependent LO leakage into the direct conversion portion of the receiver. Additionally, upconversion to a higher IF can substantially relax harmonic rejection requirements in the direct downconversion portion of the receiver.

Figure 1:
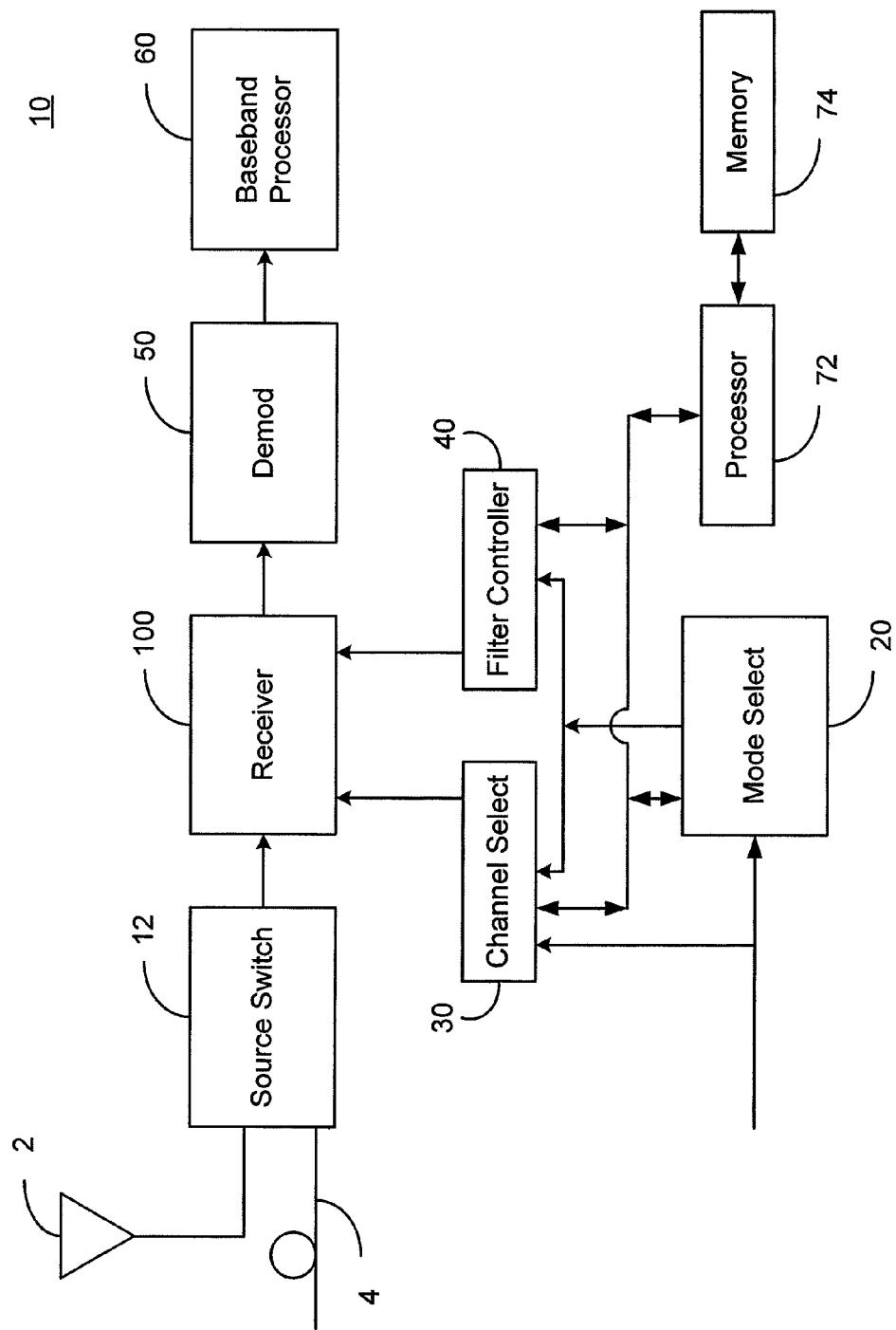
FIG. 1 is a simplified functional block diagram of an embodiment of a receiver in a system.

FIG. 1 is a simplified functional block diagram of an embodiment of a receiver 100 implementing digital IF generation in a system 10. The following description describes an embodiment in which the system 10 is configured to operate as a television receiver. However, the system 10 can be any of a plurality of systems. For example, the system 10 can be a television, television receiver, set top box, or television tuner integrated within a video recorder or some other television receiver. In other embodiments, the system 10 can be a radio receiver, wireless transceiver, telephone receiver, cellular telephone, cordless telephone, or some other communication device.

The system 10 can include a source switch 12 that can be coupled to one or more signal sources. For example, a first source input can be coupled to an antenna 2 and a second source input can be coupled to a wired source, such as a cable coupled to a cable television distributor. The source switch 12 is not limited to coupling only one type of signal to the receiver 100. For example, the source switch 12 can be coupled to a television signal source, for example, via the antenna 2, and can be coupled to a radio source, for example, via the cable 4.

The source switch 12 can be configured to couple any one of the signals from any signal source to the input of the receiver 100. The receiver 100 can be, for example, configured to selectively process television signals received from a signal source, such as analog television signals formatted according to an analog television standard, such as NTSC, PAL, SECAM, or some other analog television standard. The receiver 100 can also be configured to process digital television signals, such as digital DVB-T television signals, received from one of the signal sources.

The receiver 100 can receive the RF signal from the source switch 12 and can downconvert the signal to an output IF. The output IF from the receiver 100 can be coupled to a demodulator 50 and from the demodulator 50 to a baseband processor 60. In one embodiment, the demodulator 50 can be configured to demodulate a television signal at a predetermined IF. The demodulated television signals are communicated to a baseband processor 60 that can be configured, for example, to format the signals into video and audio signals for corresponding video and audio output devices (not shown).

The system 10 can also include a mode selection module 20 that can be configured to receive a mode selection input from an external source (not shown) that can be, for example, a user selection or user control. The mode can correspond to an operating mode of the receiver 100, and can be used to determine a particular operating band, channel spacing, channel bandwidths, and output IF frequency.

The mode select module 20 can be coupled to a channel select module 30. The channel select module 30 can be coupled to the mode select module 20 and can be configured to generate the desired local oscillator (LO) control signals. The channel select module 30 can generate the control signals needed to tune the LO frequencies of the receiver 100 to enable reception of the desired RF signal and generation of the desired output IF. The channel select module 30 can also receive one or more input signals from an external source (not shown), such as a user interface or some other module or device that can indicate a desired channel selection.

The channel select module 30 can independently control the RF and IF LOs within the receiver 100. For example, the channel select module 30 can tune the RF LO to a frequency that is based on both a mode and a desired channel. The channel select module 30 can also be configured to control the frequency of the IF LO and may be configured to control the IF LO based only on the desired mode. In other embodiments, the channel select module 30 can be configured to tune both the RF and LO frequencies for each channel.

The channel select module 30 can also be configured to control calibration of the receiver 100. The calibration can include DC offset calibration and In-phase (I) and Quadrature (Q) signal balancing. For example, the channel select module 30 can control an RF switch within the receiver 100 and can initiate the DC offset calibration. In another embodiment, a calibration module within the receiver 100 can receive the channel select signals and the filter control signals and can initiate DC offset calibration, including controlling the RF switch and filter bandwidths during the duration of the DC offset calibration.

A filter controller 40 can also be coupled to the mode select module 20. The filter controller 40 can be configured to provide the control signals to the receiver 100 that control one or more filter bandwidths within the receiver 100. The filter controller 40 can be configured to set the filter bandwidths based on the channel selectivity required in the receiver 100, which can depend on the operating mode.

The filter controller 40 can also be in communication with the channel select module 30. The filter controller 40 can be configured to control the filters within the receiver 100 to predetermined bandwidths for a predetermined calibration duration following each channel change. For example, the filter controller 40 can be configured to tune the filters to a minimal bandwidth during DC offset calibration. Alternatively, a calibration module within the receiver 100 can be configured to control the filter bandwidths during the calibration duration.

A processor 72 and associated memory 74 can be included within the system 10 and can be configured to perform one or more functions within each of the modules. For example, the memory 74 can include one or more processor 72 usable instructions in the form of software that can, when executed by the processor 72, perform some or all of the functions of the various modules within the system 10.

Figure 2:
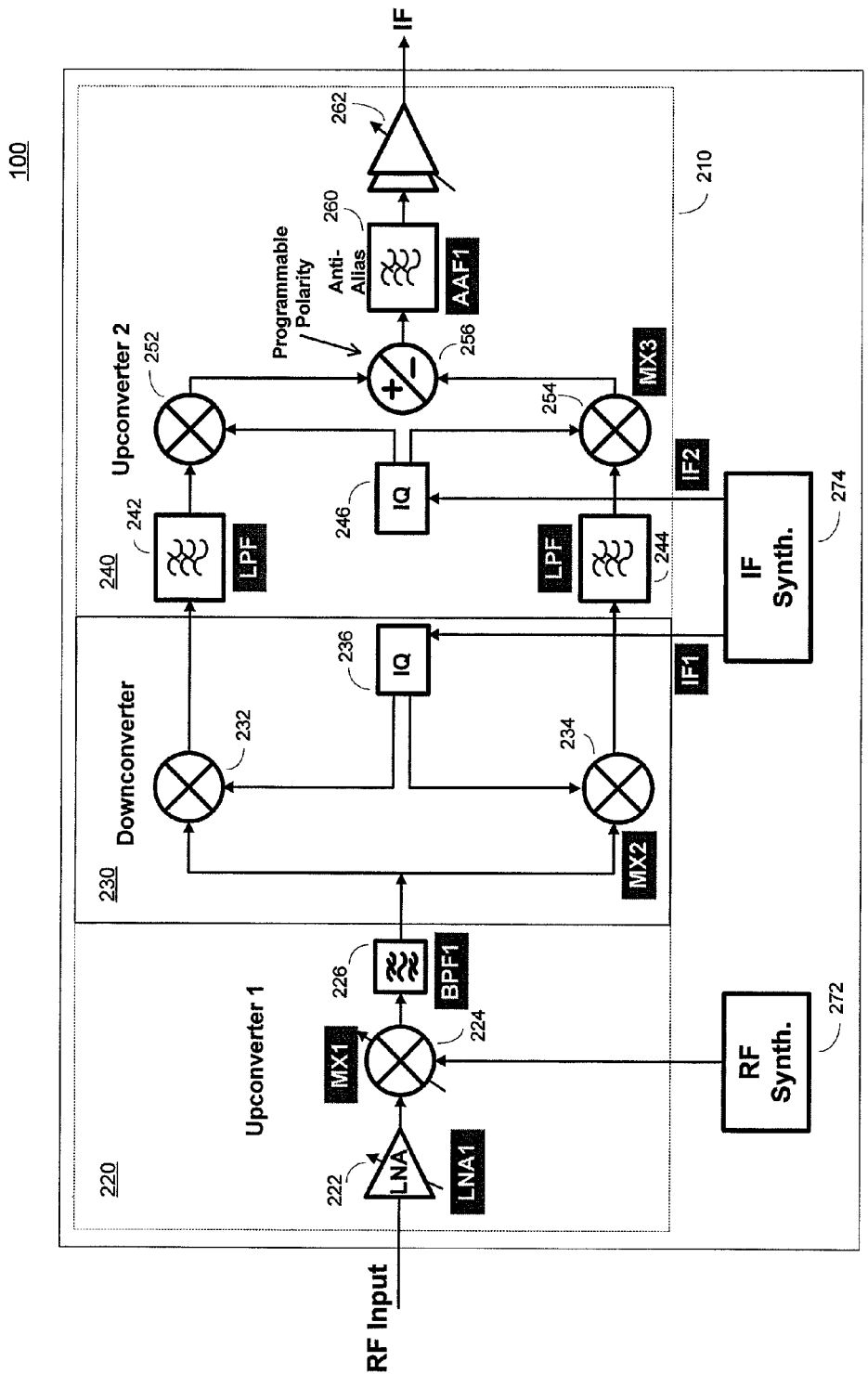
FIG. 2 is a simplified functional block diagram of an embodiment of a receiver having initial signal upconversion.

FIG. 2 is a simplified functional block diagram of an embodiment of a receiver 100, such as the receiver in the system shown in FIG. 1. The receiver 100 includes a signal processing portion 210, alternatively referred to as a signal path, an RF synthesizer 272 configured to generate a first Local Oscillator (LO) signal, and an IF synthesizer 274 configured to generate a plurality of IF LO signals.

The signal processing portion 210 includes three major functional portions. The receiver portions include a first upconverter 220 coupled to a downconveter 230 that, in turn, is coupled to a second upconverter 240. Therefore, the desired signal is initially upconverted, then downconverted to baseband or low IF, and upconverted to a final output IF.

The first upconverter 220 includes an RF amplifer 222 coupled to the RF input. The RF amplifier 222 can be a variable gain or fixed gain amplifier configured to amplify the desired RF channel. In the embodiment of FIG. 2, the RF amplifier 222 is implemented as a variable gain Low Noise Amplifier (LNA), whose gain may be determined by a controller (not shown) or an Automatic Gain Control (AGC) loop (not shown). If the RF amplifier 222 is part of an AGC loop, the RF signal at the input to the RF frequency converter 224 can experience a relatively small dynamic range.

The output of the RF amplifier 222 is coupled to an input of an RF frequency converter 224 configured to upconvert the desired channel to a high IF that is greater than the RF frequency of the desired channel. An output of the RF synthesizer 272 is coupled to a second input of the RF frequency converter 224. The RF frequency converter 224 can be configured to upconvert the desired channel to an IF that is based on the frequencies of the desired channel and the RF synthesizer 272. In one embodiment, the RF frequency converter 224 is a mixer that is configured to output the upconverted signal at a frequency that is the sum of the desired channel frequency and the RF synthesizer frequency.

The RF synthesizer 272 can have a programmable output frequency or a fixed output frequency. Where the RF synthesizer 272 is programmable, the output frequency may be controlled such that the RF frequency converter 224 upconverts the desired channel to a predetermined frequency.

The upconverted RF channel output from the RF frequency converter 224 is coupled to a first filter 226. The first filter 226 can be configured to perform band selection or some relaxed form of channel selection. Because the desired channel is upconverted to a higher frequency than the original RF frequency, the ability to perform substantial channel selection is greatly reduced, if not eliminated. Thus, the first filter 226 can be configured to perform band selection and can attenuate out of band signals as well as undesired mixer products.

The output of the first filter 226 represents the output of the first upconverter 220. the upconverted RF signal is coupled to the input of the downconverter 230. The down converter 230 is configured to quadrature downconvert the upconverted RF signal. Additionally, the downconverter 230 can be configured to direct convert the upconverted RF signal to baseband or low IF.

As used herein, the term baseband signal refers to baseband signals as well as to signals that are substantially baseband signals. A signal is substantially a baseband signal if the frequency conversion process to downconvert a signal is imperfect, for example, due to LO offset errors or differences at the transmitter or receiver and errors or differences in the input RF signal relative to a specified frequency of operation. For example, an input RF signal may be different from a specified operating channel due to LO frequency shifts at the transmitter or Doppler shifts. Typically, the error or difference is a fraction of the baseband signal bandwidth.

A low IF signal can refer to an IF frequency that is less than twice the baseband signal bandwidth. However, in other embodiments, low IF can refer to less than 1.5, 2.5, 3, 4, 5, 10, or some other multiple of the baseband signal bandwidth. Typically, a low IF signal refers to a signal that is at a frequency sufficiently low to allow processing of the signal without additional frequency conversions.

The upconverted RF signal is coupled to inputs of first and second frequency conversion modules, here shown as a first mixer 232 and a second mixer 234. The first and second mixers 232 and 234 are shown as mixers, but can be any type of frequency conversion device. For example, the first and second mixers 232 and 234 can be double balanced mixers, double-quadrature mixers, harmonic reject mixers, interferometers, or some other type of frequency conversion device. The first and second mixers 232 and 234 can be configured to generate in-phase (I) and quadrature (Q) frequency converted signal components. The first mixer 232 is described as part of the in-phase signal path and the second mixer 234 is described as part of the quadrature signal path for purposes of discussion.

The IF synthesizer 274 can include a first LO configured to output a first LO signal that is used to downconvert the upconverted RF signal. The first LO signal is coupled to a phase shifter 236 configured to output qudrature versions of the first LO signal. That is, the phase shifter 236 outputs an in-phase version of the first LO signal and a quadrature version of the first LO signal. The phase shifter 236 can be configured, for example, with a delay that introduces substantially a ninety degree phase shift in the quadrature signal. The in-phase LO signal is used to drive the first mixer 232, while the quadrature LO signal is used to drive the second mixer 234.

The IF syntheziser 274 can include a programmable output frequency that can be programmed to the frequency of the desired upconverted RF signal, or nearly the frequency of the desired upconverted RF signal. The If synthesizer 274 is thus programmed to allow the first and second mixers, 232 and 234, to perform direct conversion to substantially zero IF or a low IF.

The downconverted I and Q signal components represent the output of the downconverter 230. The outputs of the downconverter 230 are coupled to a second upconverter 240 for upconversion to the final output IF.

The second upconverter 240 can include in-phase and quadrature signal paths. The output of the first mixer 232 can be an in-phase baseband signal that is coupled to an in-phase filter 242. The in-phase filter 242 can be programmable filter whose bandwidth can be selected based on one or more control signals (not shown) provided to the receiver 100. The bandwidth of the in-phase filter 242 can be selected, for example, based on a communication standard or mode that the receiver 100 is configured to support. Therefore, where the receiver 100 is configured to support multiple standards having different channel bandwidths, the bandwidth of the in-phase filter 242 can be selected based in part on the presently supported mode.

When the signal is a baseband signal or a low IF signal, the in-phase filter 242 can be configured as a low pass filter. Alternatively, the in-phase filter 242 can be configured as a bandpass filter if the low IF signal has sufficient bandwidth to make the use of a low pass filter undesirable or if the filter is configured to substantially remove DC components.

The output of the in-phase filter 242 can be coupled to a third mixer 252 configured to frequency convert the in-phase signal to a desired output IF. In one embodiment, the output of the in-phase filter 242 is a baseband signal and the third mixer 252 is configured to upconvert the in-phase baseband signal to an output IF.

The third mixer 252 can be driven by a programmable LO that is generated in much the same manner that is used to generate the LO for the first and second mixers 232 and 234. The IF synthesizer 274 can include a second LO configured to generate a signal that is substantially the desired output IF. The IF synthesizer 274 can be programmable to allow the output IF to be selected based in part on the mode supported by the receiver 100. For example, the receiver 100 can be configured to frequency convert the input signals to a predetermined IF that can depend on the manner in which the user configures the system having the receiver 100. For example, a set top box for television signals can be configured to generate an output signal at a predetermined IF, such as 70 MHz, or at a frequency corresponding to a television channel.

The output of the IF synthesizer 274 can be coupled to a second phase shifter 246 that can be configured to generate in-phase and quadrature versions of the LO. An in-phase LO output from the second phase shifter 246 can be coupled to the LO input of the third mixer 252. The output of the third mixer 252 is an in-phase IF signal that is coupled to a first input of a signal combiner 256.

The quadrature signal path is configured to be substantially identical to the in-phase signal path. The two signal paths are typically substantially matched to reduce undesirable signal components that can be generated due to I and Q mismatches.

The output of the second mixer 234 is coupled to a quadrature filter 244 for channel selection. The output of the quadrature filter 244 is coupled to a fourth mixer 254 configured to upconvert the quadrature baseband or low IF signal to a quadrature IF signal component. The quadrature IF signal component is coupled to a second input of the signal combiner 256.

The signal combiner 256 can be configured to combine the in-phase and quadrature IF signals. The signal combiner 256 can be, for example, a signal summer that sums the in-phase IF signal with the quadrature IF signal. The signal combiner 256 can be programmed to change the polarity of one or more of the input signals.

In one embodiment, the signal combiner 256 sums the two signals maintaining their phases. In another embodiment, the signal combiner 256 can invert one of the phases and sum the two signals. In yet another embodiment, the signal combiner 256 can generate the sum of the two signals and can invert the output signal.

The output of the signal combiner 256 represents the composite output IF signal. The output IF signal can be coupled to an output filter 260 that can be, for example, a low pass filter or bandpass filter that is configured to remove undesired signal products from the IF output signal. The output filter 260 can be configured as an anti-aliasing filter where data conversion is performed after the receiver 100. The output filter 260 can be configured as a fixed bandwidth filter or can be configured as a programmable bandwidth filter, where the bandwidth is determine, in part, based on a mode of the receiver 100.

The output of the output filter 260 can be coupled to an IF amplifier 262 that can be configured to amplify the output. The IF amplifier 262 can be a variable gain amplifier. The gain of the IF amplifier 262 can be controlled using one or more control inputs (not shown) on the receiver 100. The output of the IF amplifier 262 can be the output of the receiver 100.

The receiver 100 can also include DC offset correction or I/Q imbalance modules (not shown) in order to further improve the performance of the receiver 100.

Figure 3:
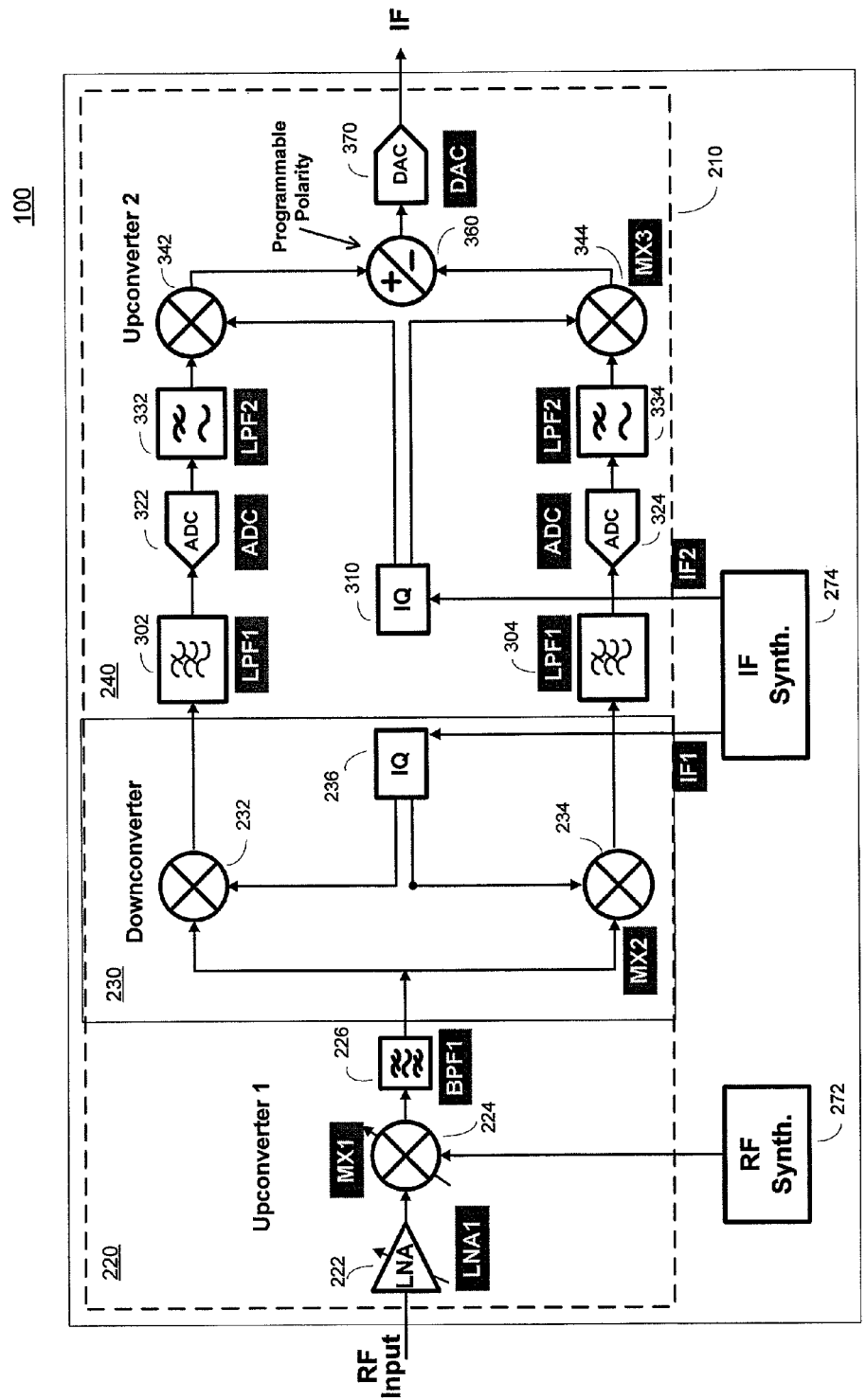
FIG. 3 is a simplified functional block diagram of an embodiment of a receiver having initial signal upconversion.

FIG. 3 is a simplified functional block diagram of an embodiment of a receiver 100 implementing upconversion prior to downconversion. The receiver 100 is configured similar to the receiver of FIG. 2, except that the second upconversion 240 is performed in the digital domain. The conversion of the signal to digital domain allows for much simpler, much more precise filtering to be performed, reducing power and area requirements in many applications. The signal is converted back to analog domain by a DAC 370. A reconstruction filter (not shown) can be implemented after the DAC 370.

The receiver in FIG. 3 performs the first upconversion and the downconversion substantially identical to that performed by the receiver in FIG. 2. However, the receiver 100 implements a digital second upconverter 240.

The in-phase baseband signal component (or in-phase low-IF signal component) is coupled to an in-phase filter 302 that can be configured to perform partial channel selection and anti-alias filtering. Because channel selection can also be performed in the digital domain, the in-phase filter 302 can have relaxed performance requirements and may be used primarily as an anti-aliasing filter.

The output of the in-phase filter 302 is coupled to a first Analog to Digital Converter (ADC) 322 that converts the signal to a digitized in-phase signal component. The digitized signal is coupled to a first digital filter 332 that can perform channel selection. The output of the first digital filter 332 can be coupled to a third mixer 342 configured to digitally upconvert the filtered in-phase signal component to a digital in-phase IF component. The digital in-phase IF component is coupled to a digital signal combiner 360 for combination wit the digital quadrature IF component.

Similar to the analog second upconverter described in relation to the receiver of FIG. 2, the digital second upconverter 240 includes a complementary quadrature signal path. The downconverted quadrature signal component is coupled to a quadrature filter 334 for at least partial channel selection and anti-alias filtering.

The output of the quadrature filter 304 is coupled to a second ADC 324 where the signal is digitized. The digitized quadrature signal is coupled to a second digital filter 334 for channel selection.

The filtered quadrature signal is coupled to a fourth mixer 344 for upconversion to the output IF. A second LO output from the IF synthesizer 274 is coupled to a phase shifter 310 that generates I and Q versions of the LO signal. The in-phase LO signal is coupled to the third mixer 342 while the quadrature phase LO signal is coupled to the fourth mixer 344.

The combined output from the digital combiner 360 is coupled to a DAC 370 for conversion to an analog IF signal.

The analog signal can be coupled to a filter or directly to a demodulator for further processing.

Figure 4:
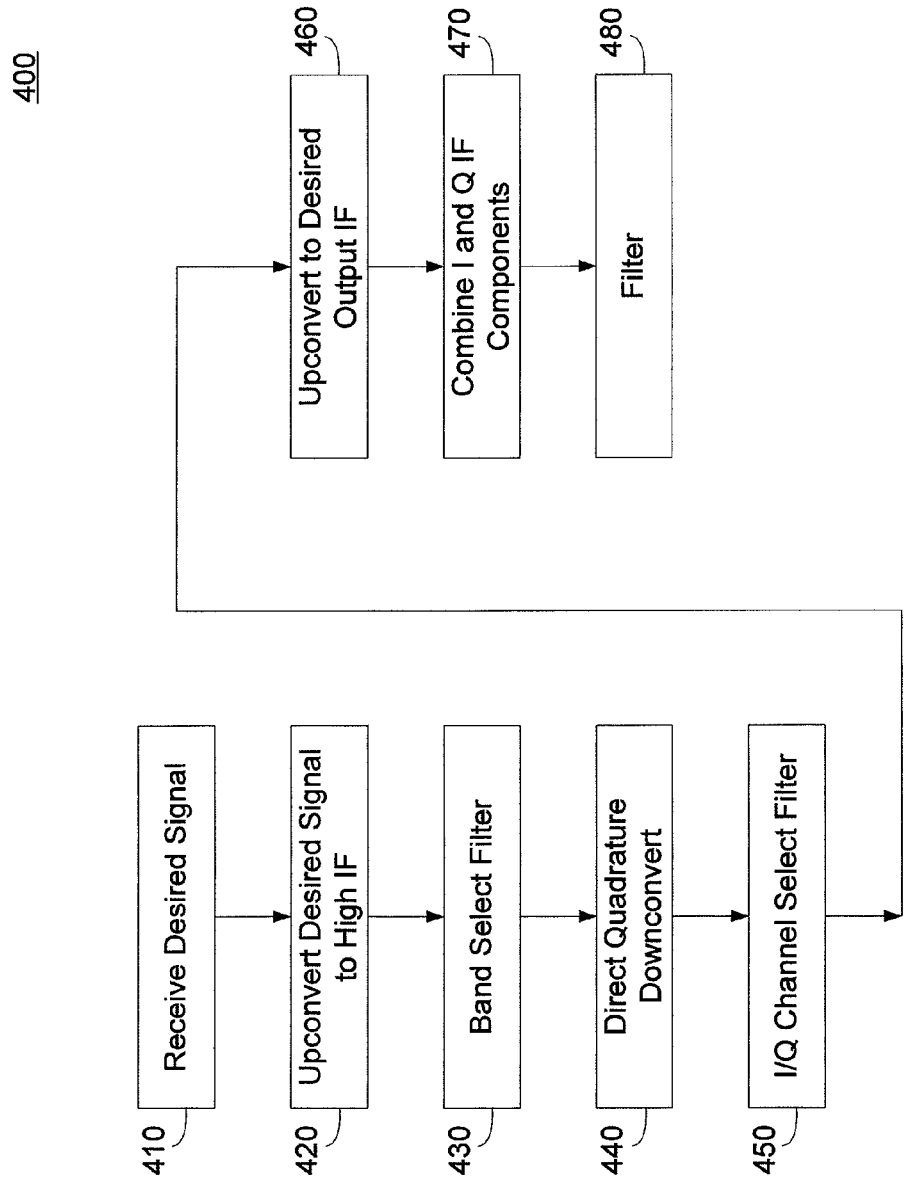
FIG. 4 is a simplified flowchart of an embodiment of a method of processing received signals.

FIG. 4 is a simplified flowchart of an embodiment of a method 400 of processing a received signal. The method 400 can be performed, for example, by any of the receivers shown in FIGS. 1-3.

The method 400 begins at block 410 where the receiver receives a desired signal. The receiver can receive the desired signal as a result of a source selection and mode selection that can communicate LO control signals to the receiver.

The receiver proceeds to block 420 and upconverts the desired signal to a high IF, where the high IF is at a frequency greater than the RF frequency of the desired channel. The receiver can upconvert the desired channel to a fixed high IF frequency, or can convert the desired channel to a high IF band of frequencies.

The receiver proceeds to block 430 and can perform band select filtering on the upconverted signal. After band selection, the receiver can proceed to block 440 and perform direct qudrature downconversion to baseband or low IF frequencies. The receiver can downconvert to baseband frequencies for particular modes and can downconvert to low IF for other operating modes. The receiver generates I and Q signal components at the baseband or low IF, depending on the configuration. The receiver can perform direct conversion using a single frequency conversion stage, for example, converting the upconverted RF signal directly to I and Q zero IF signal components.

After quadrature downconversion, the receiver proceeds to block 450 and performs channel selection on each of the downconverted I and Q signals. After channel selection filtering, the receiver can proceed to block 460 and can upconvert the I and Q signals to a desired output IF. The receiver can utilize a programmable LO to upconvert the I and Q signal components to I and Q IF signal components, respectively.

The receiver proceeds to block 470 and combines the I and Q IF signal components to generate a composite IF signal at the output IF. The receiver can proceed to block 480 and can filter the composite IF signal, for example, to remove any undesired mixer products.

A receiver and method of processing received signals are disclosed. The receiver can implement upconversion followed by direct downconversion to baseband or low IF. The receiver can perform quadrature downconversion of the upconverted signal. The receiver can perform channel selection on the I and Q signals after downconversion. The filtered I and Q signals can be upconverted to I and Q IF signals, respectively. The receiver can combine the I and Q IF signals to generate a composite IF output signal.

The various embodiments of the disclosure can be used for a wide variety of communication receivers where a desired signal needs to be downconverted and separated from undesired signals (such as interferers located at harmonics of the desired channel) and where the desired bandwidth and spectral characteristics of the received signal make harmonic rejection an desirable characteristic of the receiver.

The receiver can be implemented on a single IC. Such an implementation allows the various elements to be better matched than is generally possible using discrete elements or multiple ICs. The ability to closely match the elements of the receiver can reduce the level of DC offset error attributable to element mismatches.

The receiver can be implemented on an integrated circuit using various semiconductor processes. Some or all of the functional blocks can be implemented in a single IC, for example, on a single substrate. Alternatively, one or more functional blocks can be implemented on a plurality of substrates, and the plurality of substrates can be implemented in one or more ICs.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A receiver comprising:
   an upconverter configured to frequency convert an input signal to an intermediate frequency (IF) signal in a frequency band greater than at least a portion of the input signal frequency band;
   a downconverter coupled to the upconverter and configured to frequency convert the intermediate frequency signal to a baseband signal;
   a lowpass filter coupled to the downconverter and configured to filter the baseband signal;
   an analog upconverter coupled to the lowpass filter and configured to upconvert the filtered baseband signal to an in-phase component and a quadrature component; and
   a signal combiner coupled to the analog upconverter and configured to combine the in-phase and quadrature components to generate a composite output signal;
   wherein the signal combiner is adapted to change polarity of the composite output signal.

2. The receiver of claim 1, wherein the intermediate frequency signal comprises a fixed frequency signal.

3. The receiver of claim 1, wherein the intermediate frequency signal comprises a programmable frequency signal.

4. The receiver of claim 1, wherein the downconverter comprises a quadrature downconverter configured to direct downconvert the intermediate frequency signal to in-phase and quadrature baseband signal components.

5. The receiver of claim 1, further comprising a first filter coupled to an output of the analog upconverter and configured to perform band select filtering of the in-phase and quadrature components.

6. The receiver of claim 1, wherein the lowpass filter is configured to perform channel selection filtering of the baseband signal.

7. The receiver of claim 1, wherein the signal combiner is configured to invert a polarity of one of the in-phase and quadrature IF signals before combining them.

8. A receiver comprising:
   a first upconverter configured to upconvert a desired RF signal to a first Intermediate Frequency (IF) that is greater than a frequency of the desired RF signal;

a filter coupled to the upconverter and configured to perform band selection filtering of a signal output by the upconverter to generate a filtered upconverted signal;

a quadrature direct downconverter configured to downconvert a desired signal in the filtered upconverted signal to in-phase and quadrature signal components;

a first filter coupled to the quadrature direct downconverter and configured to perform channel selection filtering on the in-phase signal component;

a second filter coupled to the quadrature direct downconverter and configured to perform channel selection filtering on the quadrature signal component;

a second upconverter coupled to the first and second filters and configured to upconvert the filtered in-phase and quadrature signal components to second in-phase and quadrature output signal components; and a signal combiner coupled to the second upconverter and configured to combine the second in-phase and quadrature output signal components to output a composite signal;

wherein the signal combiner is adapted to change polarity of the composite signal.

9. The receiver of claim 8, wherein the second upconverter comprises a digital upconverter configured to digitally upconvert the filtered in-phase and quadrature signal components.

10. The receiver of claim 8, wherein the desired RF signal comprises an analog television signal.

11. The receiver of claim 8, wherein the desired RF signal comprises a digital television signal.

12. The receiver of claim 8 further comprising a digital-to-analog converter module configured to convert the digital composite signal to an analog composite signal.

13. The receiver of claim 8, wherein the signal combiner is a digital signal combiner.

14. A method of processing a received signal, the method comprising:

upconverting a desired input signal to a first intermediate frequency (IF) signal that is greater than a frequency of the desired input signal;

downconverting the first IF signal to a baseband signal;

performing channel selection on the baseband signal;

upconverting the selected channel to a second signal having an in-phase component and a quadrature component, said second signal having a frequency higher than the baseband signal frequency;

combining the in-phase and quadrature components to generate a composite output signal; and inverting polarity of the composite output signal.

15. The method of claim 14, further comprising filtering the first IF signal to select a desired band of signals.

16. The method of claim 14, further comprising filtering the composite output signal.

17. The method of claim 14, wherein downconverting the first IF signal comprises direct quadrature downconverting the first IF signal to an in-phase baseband signal component and a quadrature baseband signal component.

18. The method of claim 14, wherein performing channel selection comprises filtering each of an in-phase baseband signal component and a quadrature baseband signal component.

19. A method of processing a received signal, the method comprising:

selecting a desired television signal at a desired RF channel;

upconverting the desired television signal to a first Intermediate Frequency (IF) that is greater than a frequency of the desired RF channel;

direct downconverting the desired television signal from the first IF to in-phase and quadrature signal components;

performing channel selection filtering on each of the in-phase and quadrature signal components;

upconverting the filtered in-phase and quadrature signal components to second IF in-phase and quadrature signal components at a desired second IF;

combining the second IF in-phase and quadrature signal components to generate a composite signal at the second IF; and inverting polarity of the composite signal.

20. The method of claim 19, further comprising digitizing each of the in-phase and quadrature signal components, and wherein channel selection filtering comprises digital filtering.

21. The method of claim 19, wherein the in-phase and quadrature signal components comprise an in-phase baseband signal component and a quadrature baseband signal component.

22. The method of claim 19, wherein the in-phase and quadrature signal components comprise an in-phase low IF signal component and a quadrature low IF signal component.

* * * * *